(12) United States Patent
Ikeda

(10) Patent No.: US 11,489,434 B2
(45) Date of Patent: Nov. 1, 2022

(54) POWER TRANSDUCER INCLUDING A RATE OF VOLTAGE CHANGE DETECTION CIRCUIT

(71) Applicant: Kabushiki Kaisha Toshiba, Tokyo (JP)

(72) Inventor: Kentaro Ikeda, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 16/948,234

(22) Filed: Sep. 9, 2020

(65) Prior Publication Data

US 2021/0184598 A1 Jun. 17, 2021

(30) Foreign Application Priority Data

Dec. 13, 2019 (JP) .............................. JP2019-225716

(51) Int. Cl.
| | | |
|---|---|---|
| *H02M 1/08* | (2006.01) | |
| *H02M 1/00* | (2006.01) | |
| *H02M 7/539* | (2006.01) | |
| *H02M 1/32* | (2007.01) | |
| *G01R 19/12* | (2006.01) | |

(52) U.S. Cl.
CPC ........... *H02M 1/0029* (2021.05); *H02M 1/08* (2013.01); *H02M 7/539* (2013.01); *G01R 19/12* (2013.01); *H02M 1/32* (2013.01)

(58) Field of Classification Search
CPC ........ H02M 1/0029; H02M 1/32; H02M 1/44; H02M 7/539; H02M 7/53; H02M 7/537; H02M 7/48; H02M 1/0003; H02M 1/0022; H02M 1/0016; H02M 1/08; H02H 9/04; G01R 19/12

See application file for complete search history.

(56) References Cited

U.S. PATENT DOCUMENTS

| | | | |
|---|---|---|---|
| 5,270,637 A | 12/1993 | McEachern et al. | |
| 6,316,931 B1 | 11/2001 | Nakagawa et al. | |
| 8,975,902 B2 * | 3/2015 | Babb .................. | H02M 1/44 324/519 |
| 9,800,237 B2 | 10/2017 | Akama et al. | |
| 2003/0178993 A1 * | 9/2003 | Tang ................... | G01R 33/04 324/253 |

(Continued)

FOREIGN PATENT DOCUMENTS

| | | |
|---|---|---|
| JP | S58-150332 U | 10/1983 |
| JP | S61-59571 A | 3/1986 |

(Continued)

*Primary Examiner* — Alex Torres-Rivera
(74) *Attorney, Agent, or Firm* — Finnegan, Henderson, Farabow, Garrett & Dunner L.L.P.

(57) ABSTRACT

An electronic circuit includes an output node configured to output a DC signal indicating a rate of change over time of voltage at a measurement target node. The rate-of-voltage change detection circuit includes a first capacitor and a first resistor connected in series between the measurement target node and a reference voltage node, a first rectifier circuit connected between the output node and a connection node of the first capacitor and the first resistor, and a second capacitor connected between the output node and the reference voltage node.

20 Claims, 14 Drawing Sheets

(56) References Cited

U.S. PATENT DOCUMENTS

| | | | | |
|---|---|---|---|---|
| 2005/0116698 | A1* | 6/2005 | Prinz | H02M 3/157 323/283 |
| 2010/0321041 | A1* | 12/2010 | Feldtkeller | G01R 19/12 324/680 |
| 2012/0126771 | A1* | 5/2012 | Tuten | G01R 19/0053 323/284 |
| 2012/0194075 | A1* | 8/2012 | Iwai | H05B 45/50 315/119 |
| 2018/0026538 | A1* | 1/2018 | Dalena | H02M 3/158 323/271 |

FOREIGN PATENT DOCUMENTS

| | | |
|---|---|---|
| JP | H3-106111 A | 5/1991 |
| JP | H11-160377 A | 6/1999 |
| JP | 3474350 B2 | 12/2003 |
| JP | 2017-527131 A | 9/2017 |
| JP | 6237570 B2 | 11/2017 |
| WO | WO 00/36427 A1 | 6/2000 |

* cited by examiner

_US 11,489,434 B2_

POWER TRANSDUCER INCLUDING A RATE OF VOLTAGE CHANGE DETECTION CIRCUIT

CROSS REFERENCE TO RELATED APPLICATIONS

This application is based upon and claims the benefit of priority from the prior Japanese Patent Application No. 2019-225716, filed on Dec. 13, 2019, the entire contents of which are incorporated herein by reference.

FIELD

The present invention relates to an electronic circuit, a semiconductor device, and an electronic apparatus.

BACKGROUND

EVs and HVs demand a large drive voltage to drive motors. For that reason, an EV and an HV are provided with a power transducer that converts a DC voltage over 100 V into an AC voltage. A power transducer turns on and off a switching element such as a power MOSFET and IGBT to generate an AC voltage. A rate of change over time of the AC voltage generated by the switching element fluctuates due to noise or load fluctuations, which could lead to unstable operation of a motor.

The AC voltage generated by turning on and off the switching element has a voltage level that widely fluctuates with time, and it is not easy to accurately measure a rate of change over time. The rate of change over time may be converted, for example, from a voltage waveform shown by a display of a measuring instrument such as an oscilloscope, but such a configuration consumes time and causes a problem that the rate of change over time of the AC voltage cannot be detected in real time.

DETAILED DESCRIPTION

According to one embodiment, an electronic circuit includes an output node configured to output a DC signal indicating a rate of change over time of voltage at a measurement target node. The rate-of-voltage change detection circuit includes a first capacitor and a first resistor connected in series between the measurement target node and a reference voltage node, a first rectifier circuit connected between the output node and a connection node of the first capacitor and the first resistor, and a second capacitor connected between the output node and the reference voltage node.

First Embodiment

Figure 1:
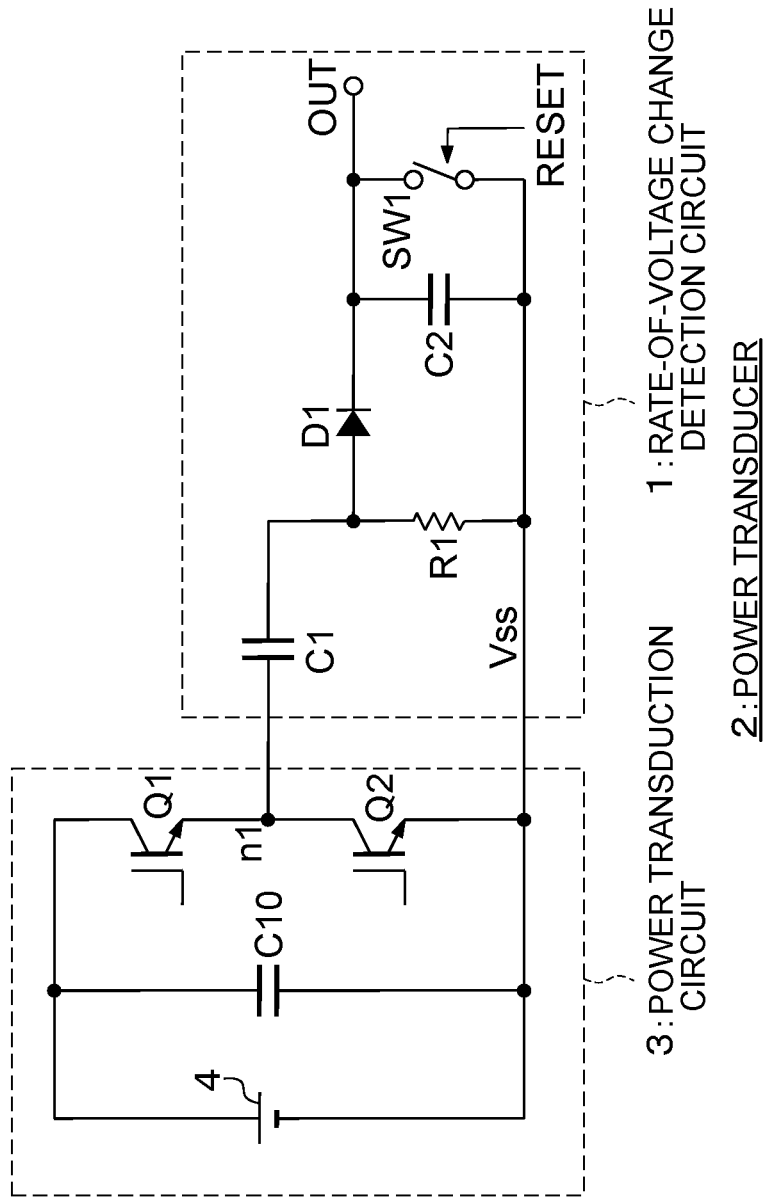
FIG. 1 is a circuit diagram of a power transducer including a rate-of-voltage change detection circuit according to a first embodiment.

FIG. 1 is a circuit diagram of a power transducer 2 including a rate-of-voltage change detection circuit 1 according to a first embodiment. The rate of voltage change detection circuit 1 can be also called as an electronic circuit. The rate-of-voltage change detection circuit 1 in FIG. 1 is connected to a measurement target node n1 or an output node of a power transduction circuit 3. The power transducer 2 includes the rate-of-voltage change detection circuit 1 and the power transduction circuit 3. The power transduction circuit 3 uses, for example, switching elements Q1 and Q2 to transduce a DC voltage into an AC voltage. The power transduction circuit 3 in FIG. 1 includes a DC source 4, a capacitor C10, and the switching elements Q1 and Q2, but the power transduction circuit 3 is not limited in circuit configuration.

The rate-of-voltage change detection circuit 1 in FIG. 1 detects a rate of change over time dv/dt of output voltage of the power transduction circuit 3. Hereinafter, the output node of the power transduction circuit 3 will be referred to as "measurement target node n1". The rate-of-voltage change detection circuit 1 in FIG. 1 includes a first capacitor C1, a first resistor R1, a first rectifier circuit D1, and a second capacitor C2. The first capacitor C1 and the first resistor R1 are connected in series between the measurement target node n1 and a reference voltage node Vss. The reference voltage node Vss is, for example, a ground node. At least a part of the components of the power transduction circuit 3 in FIG. 1 can be formed on a substrate by a semiconductor process and made into a chip.

The first rectifier circuit D1 is, for example, a diode D1. In the example illustrated in FIG. 1, an anode of the diode D1 is connected to a connection node between the first capacitor C1 and the first resistor R1. A cathode of the diode D1 is connected to an output node OUT of the rate-of-voltage change detection circuit 1. The second capacitor C2 is connected between the output node OUT of the rate-of-voltage change detection circuit 1 and the reference voltage node Vss. The second capacitor C2 accumulates electric charge according to the rate of change over time dv/dt of output voltage of the power transduction circuit 3. Accordingly, the output node OUT of the rate-of-voltage change detection circuit 1 outputs a DC signal having a voltage level according to the accumulated electric charge of the second capacitor C2. This DC signal indicates the rate of change over time dv/dt of the measurement target node n1 of the power transduction circuit 3.

The rate-of-voltage change detection circuit 1 in FIG. 1 also includes a first switch SW1 that controls whether to discharge the accumulated electric charge of the second capacitor C2. The first switch SW1 is connected between the output node OUT of the rate-of-voltage change detection circuit 1 and the reference voltage node Vss. In other words, the second capacitor C2 and the first switch SW1 are connected in parallel between the output node OUT of the rate-of-voltage change detection circuit 1 and the reference voltage node Vss.

From a viewpoint of detecting the rate of change over time dv/dt of output voltage of the power transduction circuit 3, the first switch SW1 is not an indispensable component. However, after the rate-of-voltage change detection circuit 1 outputs a DC signal at a certain time according to the rate of change over time dv/dt, the rate of change over time dv/dt of output voltage of the power transduction circuit 3 at another time cannot be detected unless the accumulated electric charge of the second capacitor C2 is discharged. For this reason, the first switch SW1 is disposed in the rate-of-voltage change detection circuit 1 to periodically discharge the accumulated electric charge of the second capacitor C2.

Hereinafter described is the operation of the rate-of-voltage change detection circuit 1 illustrated in FIG. 1. With a rise in voltage at the measurement target node n1 of the power transduction circuit 3, a current transiently flows to the first resistor R1 via the first capacitor C1. This increases a voltage between both ends of the first resistor R1 and causes a current to flow via the diode D1 to the second capacitor C2 where electric charge is accumulated. Accordingly, the output node OUT of the rate-of-voltage change detection circuit 1 increases in voltage level. Even when the voltage at the measurement target node n1 of the power transduction circuit 3 reaches the peak or starts to fall, as long as the first switch SW1 is turned off, the accumulated electric charge of the second capacitor C2 is not discharged, which makes it possible to maintain the voltage level of the output node OUT connected to one end of the second capacitor C2. Therefore, the output node OUT of the rate-of-voltage change detection circuit 1 outputs a DC signal having a voltage level according to the rate of change over time dv/dt of voltage at the measurement target node n1 of the power transduction circuit 3.

Due to periodical change of voltage at the measurement target node n1 of the power transduction circuit 3, after electric charge according to dv/dt is accumulated in the second capacitor C2, the accumulated electric charge of the second capacitor C2 is to be discharged before the timing of detecting dv/dt of voltage at the measurement target node n1 of the power transduction circuit 3. Specifically, when the first switch SW1 is turned on, the accumulated electric charge of the second capacitor C2 is discharged. After the discharge in the second capacitor C2, the second capacitor C2 re-accumulates electric charge according to the rate of change over time dv/dt of voltage at the measurement target node n1 of the power transduction circuit 3, and the rate-of-voltage change detection circuit 1 outputs a DC signal having a voltage level according to dv/dt.

In this manner, the rate-of-voltage change detection circuit 1 in FIG. 1 is configured to detect, as a DC signal, the rate of change over time dv/dt of voltage at the measurement target node n1 of the power transduction circuit 3 every time the second capacitor C2 discharges with the first switch SW1.

Figure 2:
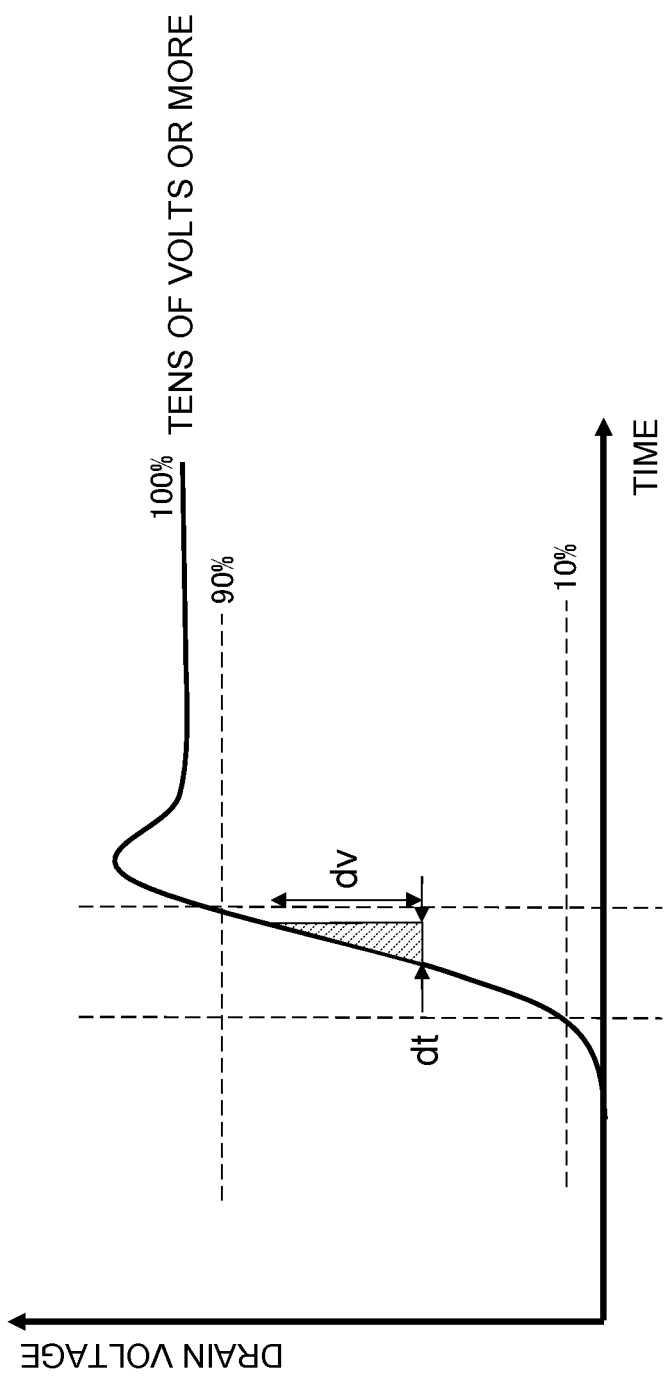
FIG. 2 is a view illustrating a voltage waveform at an output node of a power transduction circuit.

FIG. 2 illustrates a voltage waveform at the output node (measurement target node n1) of the power transduction circuit 3. From the measurement target node n1, the power transduction circuit 3 outputs an AC voltage with a voltage level changing periodically. FIG. 2 illustrates a voltage waveform in a transient state in which the voltage level of the measurement target node n1 of the power transduction circuit 3 rises from 0 V. The rate-of-voltage change detection circuit 1 according to this embodiment outputs a DC signal in which the rate of change over time dv/dt of voltage in the voltage waveform of the transient state illustrated in FIG. 2 is regarded as a voltage level. As the voltage waveform in FIG. 2 shows, the rate of change over time dv/dt of voltage at the measurement target node n1 of the power transduction circuit 3 is almost constant in the transient state. At this time, electric charge according to the rate of change over time dv/dt is accumulate in the second capacitor C2, and the output node OUT outputs a DC signal according to the accumulated electric charge.

Figure 3:
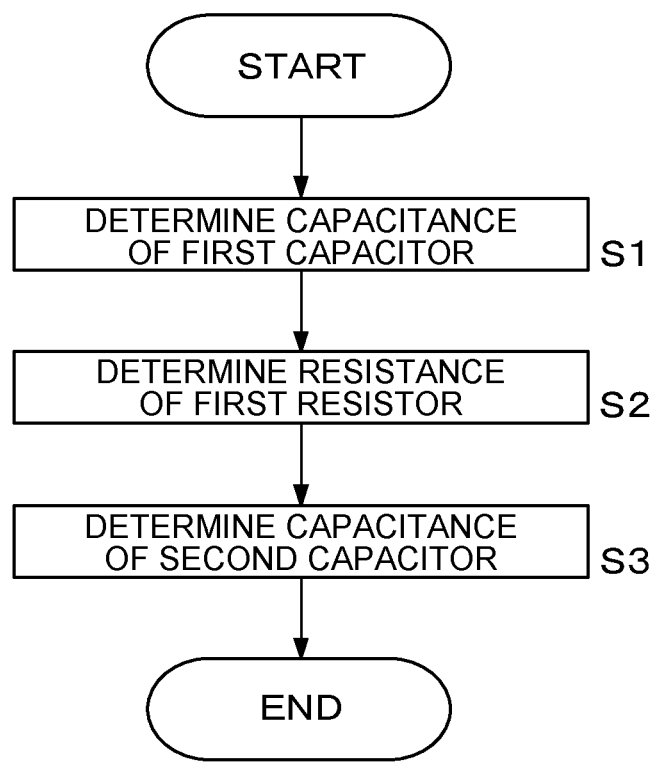
FIG. 3 is a flowchart illustrating a procedure for determining a circuit parameter of the rate-of-voltage change detection circuit.

Capacitances of the first capacitor C1 and the second capacitor C2 and a resistance of the first resistor R1 in the rate-of-voltage change detection circuit 1 according to this embodiment are determined by the procedure illustrated in FIG. 3. First, the capacitance of the first capacitor C1 is determined (step S1). Herein, for example, the capacitance of the first capacitor C1 is set to 1/10 or less of a parasitic capacitance of the power transduction circuit 3. This enables quick change of voltage at the output node OUT of the rate-of-voltage change detection circuit 1.

Next, the resistance of the first resistor R1 is determined (step S2). Based on the resistance of the first resistor R1, it is possible to control a voltage level, or the gain, of a DC signal output from the output node OUT of the rate-of-voltage change detection circuit 1.

Herein, a DC signal Vout output from the output node OUT of the rate-of-voltage change detection circuit 1 is expressed by the following Formula (1). Formula (1) is obtained by the Laplace transform of the transfer function from input to output.

$$V\text{out} = C1 \times R \times (dv/dt) \times [1 - \exp\{-t/R(C1+C2)\}] \tag{1}$$

Next, the capacitance of the second capacitor C2 is determined (step S3). Herein, the capacitance of the second capacitor C2 is determined to satisfy the following Formula (2) representing a relation between a time constant T of the power transduction circuit 3, the capacitances of the first capacitor C1 and the second capacitor C2, and the resistance of the first resistor R1. The resistance of the first resistor R1 and the capacitance of the second capacitor C2 may be determined to satisfy Formula (2) by combining the steps S2 and S3. The number "2.2" on the right-hand side of Formula (2) is a coefficient corresponding to the time until the voltage at the output node OUT of the rate-of-voltage change detection circuit 1 changes from 10% to 90%.

$$T \geq 2.2 \times R \times (C1+C2) \tag{2}$$

Herein, the time constant T of the measurement target node n1 of the power transduction circuit 3 is set to, for example, 100 nsec or less. In this case, based on Formula (2), the resistance of the first resistor R1 and the capacitance of the second capacitor C2 are determined to satisfy the following Formula (3).

$$45.5 \geq R \times (C1 + C2) \qquad (3)$$

Figure 4A:
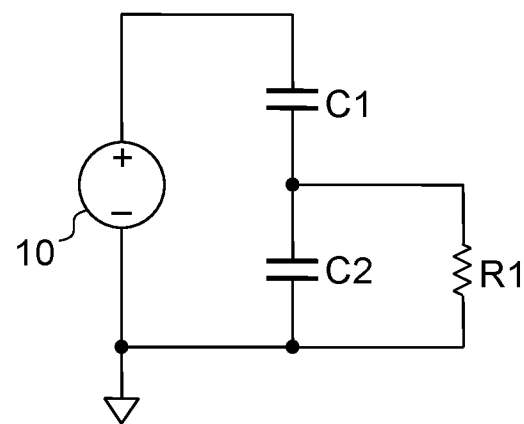
FIG. 4A is a circuit diagram used for simulation of the rate-of-voltage change detection circuit according to this embodiment.
Figure 4B:
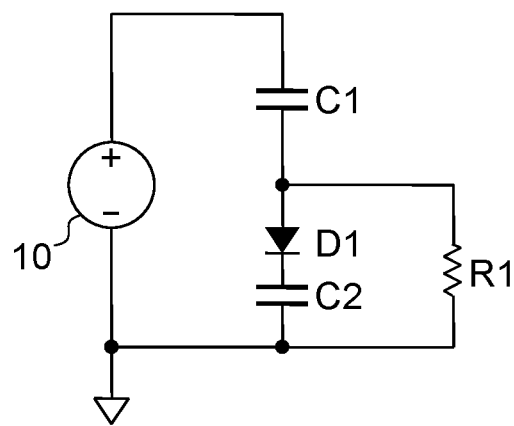
FIG. 4B is a circuit diagram with a diode being added to the circuit in FIG. 4A.
Figure 5A:
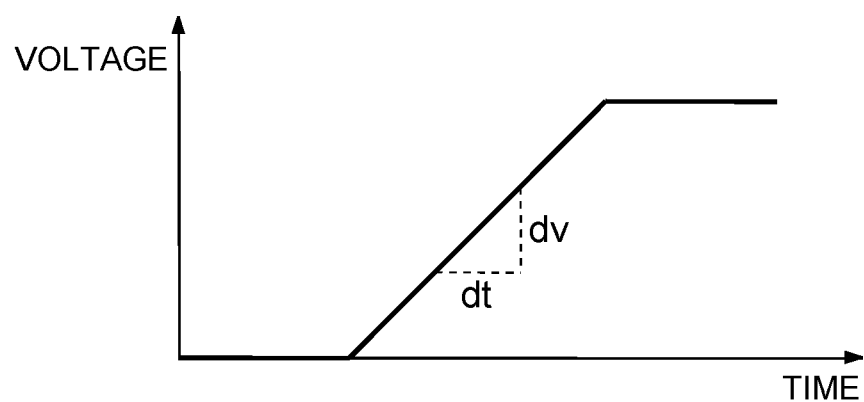
FIG. 5A is a view illustrating a voltage waveform obtained by simulation in a transient state in which an output voltage of an AC source illustrated in FIG. 4A rises from 0 V.
Figure 5B:
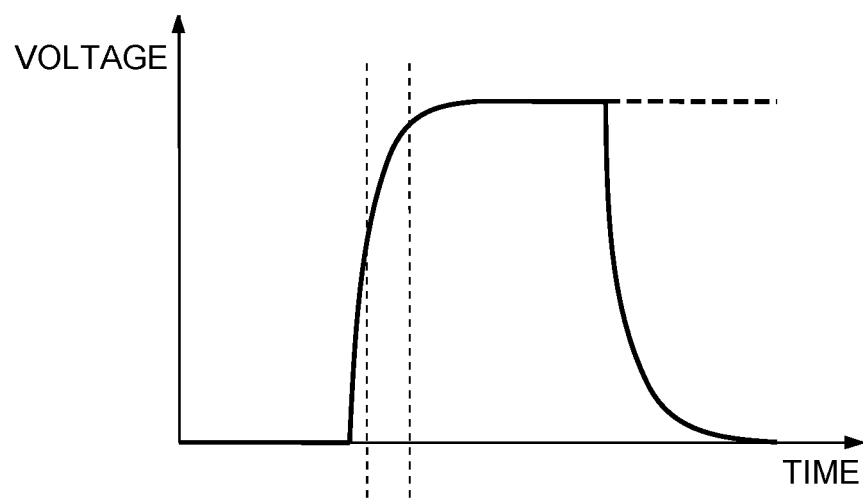
FIG. 5B is a view illustrating an output voltage waveform of the rate-of-voltage change detection circuit in FIG. 4A obtained by simulation when the voltage in FIG. 5A is applied.

FIG. 4A is a circuit diagram used for simulation of the rate-of-voltage change detection circuit 1 according to this embodiment. The circuit illustrated in FIG. 4A corresponds to the rate-of-voltage change detection circuit 1 in FIG. 1 with the diode D1 being omitted. The diode D1 per se is connected between the first capacitor C1 and the second capacitor C2 as illustrated in FIG. 4B. In FIG. 4A, an AC source 10 is connected in place of the power transduction circuit 3. FIG. 5A illustrates a voltage waveform obtained by simulation in a transient state in which an output voltage of the AC source 10 in FIG. 4A rises from 0 V. FIG. 5B illustrates an output voltage waveform of the rate-of-voltage change detection circuit 1 in FIG. 4A obtained by simulation when the voltage in FIG. 5A is applied as an output voltage of the AC source 10.

As can be seen from the voltage waveform in FIG. 5B, with a linear rise of voltage at the AC source 10, the voltage at the output node OUT of the rate-of-voltage change detection circuit 1 in FIG. 4A rises sharply, and with electric charge fully accumulated in the second capacitor C2, the voltage at the output node OUT of the rate-of-voltage change detection circuit 1 becomes constant. In this state, a DC signal according to the rate of change over time dv/dt of voltage at the measurement target node n1 of the power transduction circuit 3 in FIG. 1 is output.

Since the rate-of-voltage change detection circuit 1 in FIG. 4A does not include the diode D1, once the voltage at the measurement target node n1 of the power transduction circuit 3 reaches the peak, the accumulated electric charge of the second capacitor C2 is discharged through the first resistor R1.

If the diode D1 is connected between the second capacitor C2 and a connection node of the first capacitor C1 and the second capacitor C2 as illustrated in FIG. 4B, the circuit is similar to the rate-of-voltage change detection circuit 1 in FIG. 1, and the voltage at the output node OUT of the rate-of-voltage change detection circuit 1 maintains a constant voltage amplitude as illustrated by the dashed line in FIG. 5B.

Figure 6:
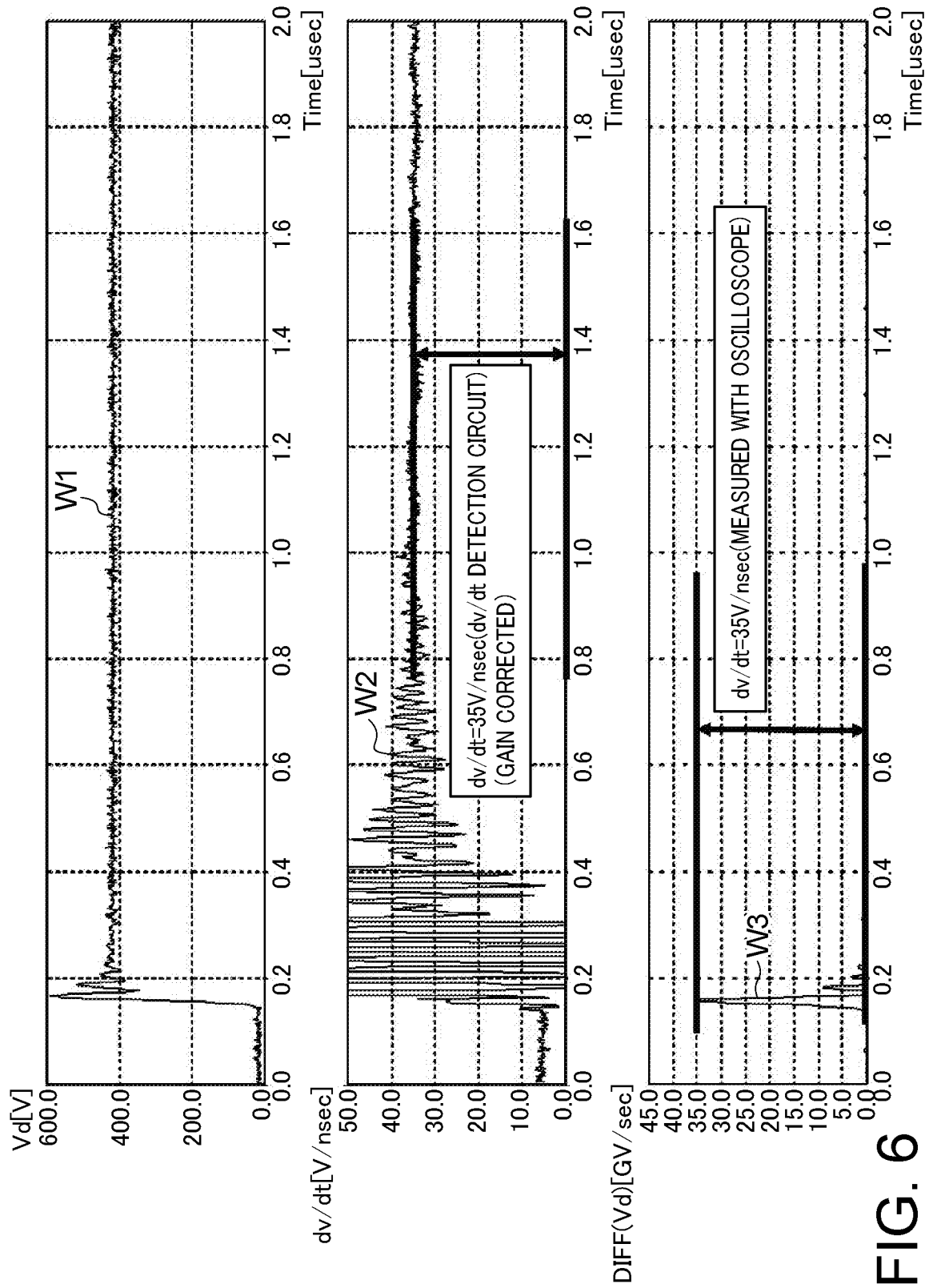
FIG. 6 is a view of a voltage waveform illustrating experimental results of the rate-of-voltage change detection circuit in FIG. 1.

FIG. 6 is a view of a voltage waveform illustrating experimental results of the rate-of-voltage change detection circuit 1 in FIG. 1. In FIG. 6, W1 is a voltage waveform at the output node OUT of the rate-of-voltage change detection circuit 1, W2 is an enlarged voltage waveform of part of W1, and W3 is a voltage waveform at the measurement target node n1 of the power transduction circuit 3. The voltage waveforms W1 to W3 are measured with an oscilloscope.

As illustrated in FIG. 6, when the voltage at the measurement target node n1 of the power transduction circuit 3 rises from 0 V, the voltage at the output node OUT of the rate-of-voltage change detection circuit 1 fluctuates widely for a while as shown by W2, but after 0.8 μsec, the voltage at the output node OUT substantially becomes a DC signal according to the voltage at the measurement target node n1 of the power transduction circuit 3. The rate of change over time dv/dt of voltage level of the stabilized DC signal is about 35 V/nsec.

On the other hand, the voltage at the measurement target node n1 of the power transduction circuit 3 changes for an extremely short time as shown by W3, having the peak of about 35 V/nsec. Comparison between W3 and W2 shows that the voltage level output from the output node OUT of the rate-of-voltage change detection circuit 1 is equivalent to the rate of change over time dv/dt of voltage at the measurement target node n1 of the power transduction circuit 3. This result shows that the rate-of-voltage change detection circuit 1 in FIG. 1 correctly detects the rate of change over time dv/dt of voltage at the measurement target node n1 of the power transduction circuit 3.

Figure 7:
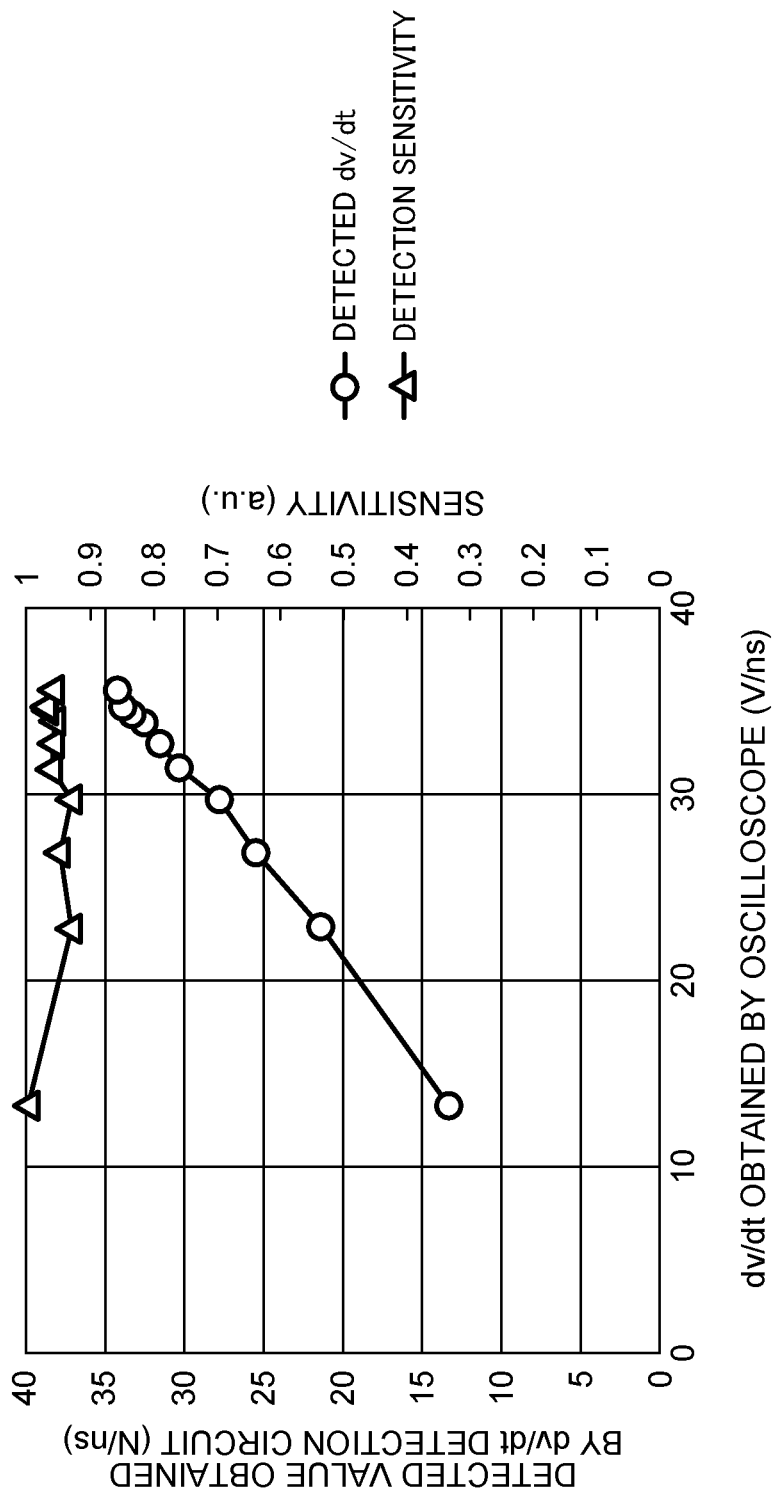
FIG. 7 is a graph illustrating detection sensitivity of the rate-of-voltage change detection circuit.

FIG. 7 is a graph showing detection sensitivity of the rate-of-voltage change detection circuit 1. In FIG. 7, g1 shows how the voltage at the output node OUT of the rate-of-voltage change detection circuit 1 changes when the rate of change over time dv/dt of voltage at the measurement target node n1 of the power transduction circuit 3 is changed. Furthermore, g2 is a graph showing how the detection sensitivity of the rate-of-voltage change detection circuit 1 changes when the rate of change over time dv/dt of voltage at the measurement target node n1 of the power transduction circuit 3 is changed.

As can be seen from g2, even when the rate of change over time dv/dt of voltage at the measurement target node n1 of the power transduction circuit 3 is changed, the detection sensitivity of the rate-of-voltage change detection circuit 1 changes little, which shows that the rate-of-voltage change detection circuit 1 is both highly practical and reliable. As can be seen from g1, the DC signal level of the output node OUT of the rate-of-voltage change detection circuit 1 is substantially linear relative to the rate of change over time dv/dt of voltage at the measurement target node n1 of the power transduction circuit 3, which shows that the rate-of-voltage change detection circuit 1 is excellent in linearity.

The rate-of-voltage change detection circuit 1 in FIG. 1 includes one diode D1 in the first rectifier circuit D1. Since this diode D1 has an anode connected to the connection node between the first capacitor C1 and the first resistor R1 and has a cathode connected to the output node OUT, a DC signal according to dv/dt is output only with a rise in voltage at the measurement target node n1 of the power transduction circuit 3. In order to output a DC signal according to dv/dt not only when the voltage at the measurement target node n1 of the power transduction circuit 3 rises but also when the voltage falls, for example, the rate-of-voltage change detection circuit 1 may include a circuit configuration as illustrated in FIG. 8.

Figure 8:
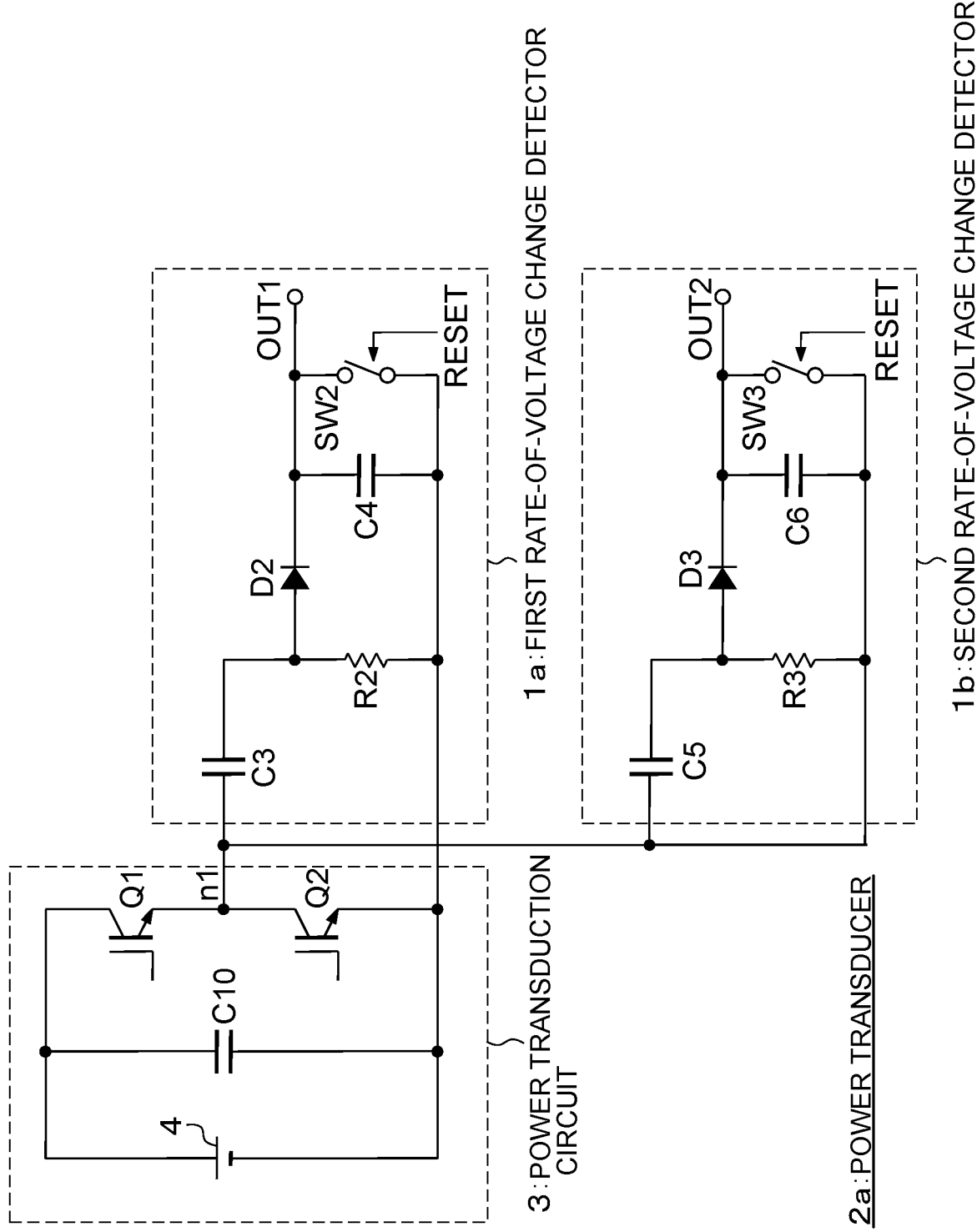
FIG. 8 is a circuit diagram of a rate-of-voltage change detection circuit according to a modification.

The rate-of-voltage change detection circuit 1 in FIG. 8 includes a first rate-of-voltage change detector 1a and a second rate-of-voltage change detector 1b. The first rate-of-voltage change detector 1a is connected to the output node (measurement target node n1) of the power transduction circuit 3 and outputs, from a first output node OUT1, a first DC signal indicating a rate of change over time dv/dt of rising voltage at the measurement target node n1. The circuit configuration of the first rate-of-voltage change detector 1a is similar to the circuit configuration of the rate-of-voltage change detection circuit 1 in FIG. 1.

More specifically, the first rate-of-voltage change detector 1a includes a third capacitor C3 corresponding to the first capacitor C1, a second resistor R2 corresponding to the first resistor R1, a second rectifier circuit D2 corresponding to the first rectifier circuit D1, a fourth capacitor C4 corresponding to the second capacitor C2, and a second switch SW2 corresponding to the first switch SW1.

The second rate-of-voltage change detector 1b is connected to the output node (measurement target node n1) of the power transduction circuit 3 and outputs, from a second output node OUT2, a second DC signal indicating a rate of change over time dv/dt of falling voltage at the measurement target node n1. The circuit configuration of the second rate-of-voltage change detector 1b is similar to the circuit configuration of the rate-of-voltage change detection circuit 1 in FIG. 1.

More specifically, the second rate-of-voltage change detector 1b includes to a fifth capacitor C5 corresponding to the first capacitor C1, a third resistor R3 corresponding to the first resistor R1, a third rectifier circuit D3 corresponding to the first rectifier circuit D1, a sixth capacitor C6 corresponding to the second capacitor C2, and a third switch SW3 corresponding to the first switch SW1.

In the rate-of-voltage change detection circuit 1 in FIG. 8, a circuit (first rate-of-voltage change detector 1a) used when the voltage at the measurement target node n1 of the power transduction circuit 3 rises and a circuit (second rate-of-voltage change detector 1b) used when the voltage falls are disposed separately. Such a configuration makes the circuit about twice as large as the rate-of-voltage change detection circuit 1 illustrated in FIG. 1.

Figure 9:
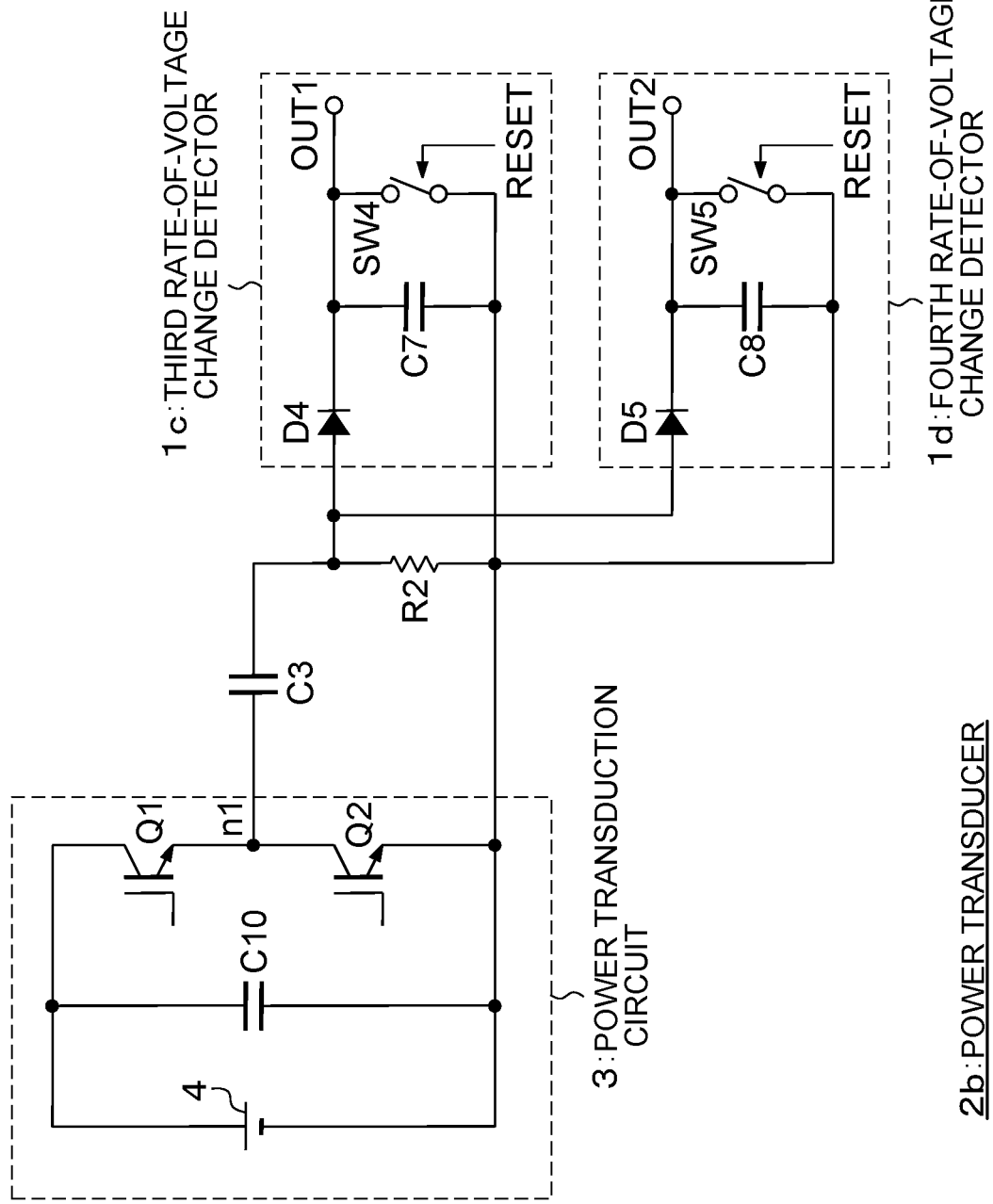
FIG. 9 is a circuit diagram of a rate-of-voltage change detection circuit according to a modification.

FIG. 9 is a circuit diagram illustrating another example of the rate-of-voltage change detection circuit 1 having a simpler circuit configuration than one illustrated in FIG. 8. The rate-of-voltage change detection circuit 1 in FIG. 9 includes a third rate-of-voltage change detector 1c and a fourth rate-of-voltage change detector 1d.

The third rate-of-voltage change detector 1c is connected to a connection node of the first capacitor C1 and the first resistor R1 and outputs, from a first output node OUT1, a signal indicating a rate of change over time dv/dt of rising voltage at the measurement target node n1. More specifically, the third rate-of-voltage change detector 1c includes a fourth rectifier circuit D4 corresponding to the first rectifier circuit D1 and a seventh capacitor C7 corresponding to the second capacitor C2. The third rate-of-voltage change detector 1c also includes a fourth switch SW4 connected in parallel to the seventh capacitor C7. The fourth switch SW4 controls whether to discharge accumulated electric charge of the seventh capacitor C7. The fourth rectifier circuit D4 is a diode having an anode connected between the first capacitor C1 and the first resistor R1 and a cathode connected to the first output node OUT1.

The fourth rate-of-voltage change detector 1d is connected to the connection node of the first capacitor C1 and the first resistor R1 and outputs, from a second output node OUT2, a signal indicating a rate of change over time dv/dt of falling voltage at the measurement target node n1. More specifically, the fourth rate-of-voltage change detector 1d includes a fifth rectifier circuit D5 corresponding to the first rectifier circuit D1 and an eighth capacitor C8 corresponding to the second capacitor C2. The fourth rate-of-voltage change detector 1d also includes a fifth switch SW5 connected in parallel to the eighth capacitor C8. The fifth switch SW5 controls whether to discharge accumulated electric charge of the eighth capacitor C8. The fifth rectifier circuit D5 is a diode having an anode connected between the first capacitor C1 and the first resistor R1 and a cathode connected to the second output node OUT2.

In the rate-of-voltage change detection circuit 1 in FIG. 9, the third rate-of-voltage change detector 1c and the fourth rate-of-voltage change detector 1d share the first capacitor C1 and the first resistor R1, which enables simplification of the circuit configuration as compared with the rate-of-voltage change detection circuit 1 in FIG. 8.

Figure 10:
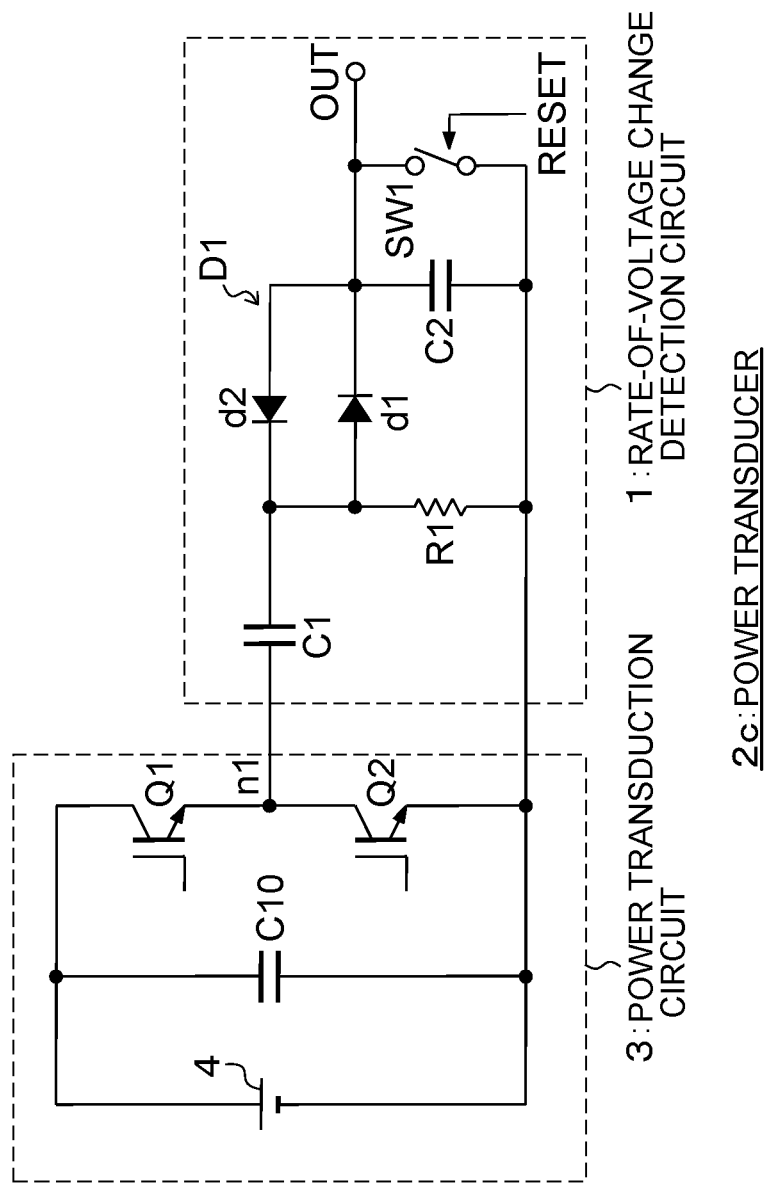
FIG. 10 is a circuit diagram of a rate-of-voltage change detection circuit according to a modification.

FIG. 10 is a circuit diagram illustrating another example of the rate-of-voltage change detection circuit 1 having a simpler circuit configuration than one illustrated in FIG. 9. The rate-of-voltage change detection circuit 1 in FIG. 10 differs from the rate-of-voltage change detection circuit 1 in FIG. 1 in the internal configuration of the first rectifier circuit D1. More specifically, the first rectifier circuit D1 in FIG. 10 includes a first diode d1 and a second diode d2. As similar to the diode in FIG. 1, the first diode d1 has an anode connected to a connection node of the first capacitor C1 and the first resistor R1 and has a cathode connected to the output node OUT of the rate-of-voltage change detection circuit 1. The second diode d2 has a cathode connected to the connection node of the first capacitor C1 and the first resistor R1 and has an anode connected to the output node OUT of the rate-of-voltage change detection circuit 1.

Figure 11:
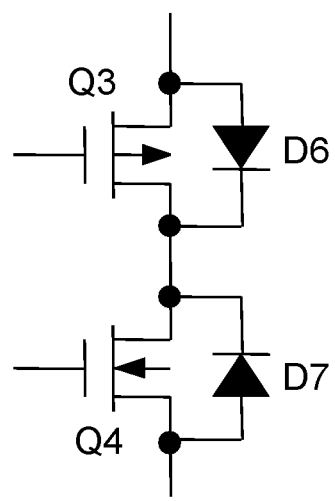
FIG. 11 is a circuit diagram of a first switch in FIG. 10.

The first switch SW1 in the rate-of-voltage change detection circuit 1 in FIG. 10 includes, for example, a PMOS transistor Q3 and an NMOS transistor Q4 which are cascode-connected as illustrated in FIG. 11. The PMOS transistor Q3 and the NMOS transistor Q4 respectively incorporate body diodes D6 and D7 each having an anode connected to a source and a cathode connected to a drain. Since the body diodes D6 and D7 are connected in opposite directions to each other, there is no risk of interfering with the operations of the PMOS transistor Q3 and the NMOS transistor Q4.

As described above, in the first embodiment, the rate of change over time dv/dt of voltage at the measurement target node n1 of the power transduction circuit 3 is detected as a DC signal. Accordingly, there is no need to calculate dv/dt from the voltage waveform at the measurement target node n1 of the power transduction circuit 3 measured with an oscilloscope or the like, which enables easy and accurate detection of dv/dt. Particularly, even after the rise time and the fall time in voltage at the measurement target node n1 of the power transduction circuit 3, the rate-of-voltage change detection circuit 1 outputs a DC signal having a voltage level according to dv/dt so that it is possible to analyze dv/dt subsequently.

Furthermore, the rate-of-voltage change detection circuit 1 according to this embodiment has a simple circuit including the first capacitor C1, the first resistor R1, the first rectifier circuit D1, and the second capacitor C2. Accordingly, it is possible to detect dv/dt at low cost.

Still further, the rate-of-voltage change detection circuit 1 according to this embodiment includes the first switch SW1 that discharges accumulated electric charge of the second capacitor C2. Accordingly, periodical discharge of the accumulated electric charge from the second capacitor C2 enables continuous output of a DC signal according to the rate of change over time dv/dt of output voltage of the power transduction circuit 3.

Since the DC signal output from the rate-of-voltage change detection circuit 1 according to this embodiment includes information associated with the rate of change over time of output voltage of the power transduction circuit 3, it is possible to return the power transduction circuit 3 to power transduction operation as will be described later. In other words, the DC signal output from the rate-of-voltage change detection circuit 1 enables determination of whether the power transduction circuit 3 properly transduces power. Accordingly, feedback of the DC signal to control a gate voltage at the switching elements Q1 and Q2 in the power transduction circuit makes it possible to optimize the power transduction operation of the power transduction circuit 3.

Second Embodiment

In a second embodiment, a DC signal output from a rate-of-voltage change detection circuit 1 is used to control a power transduction circuit 3.

Figure 12:
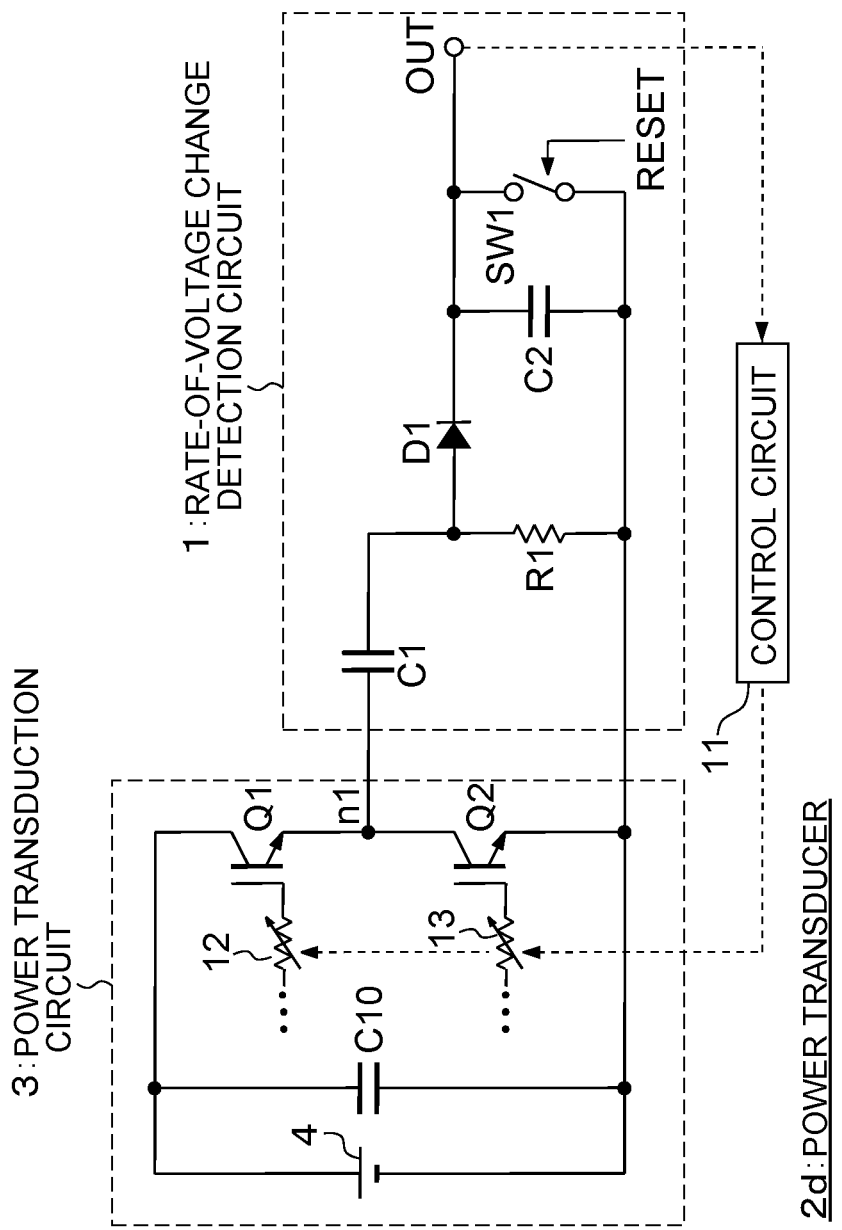
FIG. 12 is a circuit diagram illustrating a schematic configuration of a power transducer including a rate-of-voltage change detection circuit according to a second embodiment.

FIG. 12 is a circuit diagram illustrating a schematic configuration of a power transducer 2d including a rate-of-voltage change detection circuit 1 according to the second embodiment. The power transducer 2d can be also called as an electronic apparatus. The power transducer 2d in FIG. 12 includes the rate-of-voltage change detection circuit 1, the power transduction circuit 3, and a control circuit 11.

The rate-of-voltage change detection circuit 1 has a circuit configuration similar to that illustrated in FIG. 1, FIG. 8, FIG. 9, or FIG. 10. The power transduction circuit 3 includes, for example, a plurality of cascode-connected switching elements Q1 and Q2 and variable resistors 12 and 13 connected to gates of the switching elements Q1 and Q2. The power transduction circuit 3 may have any internal configuration and may employ various kinds of circuit configuration. An AC voltage converted by the power transduction circuit 3 is used to drive a load such as a motor.

The control circuit 11 controls gate voltages at the switching elements Q1 and Q2 according to a voltage level of a DC signal output from the rate-of-voltage change detection circuit 1. In a more specific example, the control circuit 11 controls resistances of the variable resistors 12 and 13 according to the voltage level of the DC signal so as to control the gate voltages at the switching elements Q1 and Q2.

The switching elements Q1 and Q2 in the power transduction circuit 3 are expected to perform switching operation at a predetermined frequency and in a predetermined duty cycle. There is a possibility that the switching operation of the switching elements Q1 and Q2 deviates from desired operation due to fluctuations in temperature and voltage or due to load fluctuations. In that case, a rate of change over time dv/dt of voltage at a measurement target node n1 in the power transduction circuit 3 differs from a desired value. Therefore, in this embodiment, the rate-of-voltage change detection circuit 1 monitors the rate of change over time dv/dt of voltage at the measurement target node n1 of the power transduction circuit 3 and outputs, to the control circuit 11, a DC signal having a voltage level according to dv/dt which is output from the rate-of-voltage change detection circuit 1. Based on the voltage level of the DC signal, the control circuit 11 controls the gate voltages at the switching elements Q1 and Q2 in the power transduction circuit 3 so that the rate of change over time dv/dt of voltage at the measurement target node n1 of the power transduction circuit 3 reaches the desired value.

In this manner, the rate-of-voltage change detection circuit 1 outputs a DC signal indicating the rate of change over time of output voltage of the power transduction circuit 3. Accordingly, it is possible to optimize power transduction operation of the power transduction circuit 3 based on the DC signal. More specifically, with the aforementioned DC signal, the gate voltages at the switching elements Q1 and Q2 in the power transduction circuit 3 are controlled, which makes it possible to control and make the output voltage waveform of the power transduction circuit 3 into a desired voltage waveform with a simple circuit configuration.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. An electronic circuit comprising:
an output node to output a DC signal indicating a rate of change over time of voltage at a measurement target node,
a first capacitor and a first resistor connected in series between the measurement target node and a reference voltage node;
a first rectifier circuit connected between the output node and a connection node of the first capacitor and the first resistor; and
a second capacitor connected between the output node and the reference voltage node.

2. The electronic circuit according to claim 1, further comprising
a switch connected between the output node and the reference voltage node, wherein
the switch controls whether to discharge accumulated electric charge of the second capacitor.

3. The electronic circuit according to claim 2,
wherein the switch is turned on to discharge the second capacitor after a voltage level of the DC signal output from the output node is stabilized.

4. The electronic circuit according to claim 1,
wherein the first capacitor has a capacitance 1/10 or less of a parasitic capacitance of the measurement target node.

5. The electronic circuit according to claim 1,
wherein a capacitance of the first capacitor, a capacitance of the second capacitor, and a resistance of the first resistor are set to a time constant of 100 nsec or less, the time constant being required until the DC signal according to a voltage change of the measurement target node is output from the output node.

6. The electronic circuit according to claim 5,
wherein the capacitance "C1" of the first capacitor, the capacitance "C2" of the second capacitor, and the resistance "R" of the first resistor are set to make the time constant "T" satisfy Formula (1):

$$T \geq 2.2 \times R \times (C1+C2) \quad (1).$$

7. The electronic circuit according to claim 1,
wherein a voltage "Vout" of the output node is expressed by Formula (2) using the rate of change over time dv/dt of voltage at the measurement target node, a capacitance "C1" of the first capacitor, a capacitance "C2" of the second capacitor, and a resistance "R" of the first resistor:

$$V\text{out} = C1 \times R \times (dv/dt) \times [1 - \exp\{-t/R(C1+C2)\}] \quad (2).$$

8. The electronic circuit according to claim 1, further comprising:
a first detector connected to the measurement target node and to output, from a first output node, a first DC signal indicating a rate of change over time of rising voltage at the measurement target node; and
a second detector connected to the measurement target node and to output, from a second output node, a second DC signal indicating a rate of change over time of falling voltage at the measurement target node,
wherein the detector includes a third capacitor corresponding to the first capacitor, a second resistor corresponding to the first resistor, a second rectifier circuit corresponding to the first rectifier circuit, and a fourth capacitor corresponding to the second capacitor, and the second detector includes a fifth capacitor corresponding to the first capacitor, a third resistor corresponding to the first resistor, a third rectifier circuit corresponding to the first rectifier circuit, and a sixth capacitor corresponding to the second capacitor.

9. The electronic circuit according to claim 1, further comprising:
a third detector connected to the connection node of the first capacitor and the first resistor and to output, from a first output node, a signal indicating a rate of change over time of rising voltage at the measurement target node; and
a fourth detector connected to the connection node of the first capacitor and the first resistor and to output, from a second output node, a signal indicating a rate of change over time of falling voltage at the measurement target node,
wherein the detector includes a fourth rectifier circuit corresponding to the first rectifier circuit and a seventh capacitor corresponding to the second capacitor, and
the fourth detector includes a fifth rectifier circuit corresponding to the first rectifier circuit and an eighth capacitor corresponding to the second capacitor.

10. The electronic circuit according to claim 1, wherein the first rectifier circuit includes:
a first diode having an anode connected to the connection node of the first capacitor and the first resistor and a cathode connected to the output node; and
a second diode having a cathode connected to the connection node of the first capacitor and the first resistor and an anode connected to the output node.

11. A semiconductor device comprising:
at least one of switching elements;
a substrate; and
an electronic circuit on the substrate,
wherein the electronic circuit includes:
an output node to output a DC signal indicating a rate of change over time of voltage at a measurement target node of the at least one of switching elements,
a first capacitor and a first resistor connected in series between the measurement target node of the at least one of switching elements and a reference voltage node;
a first rectifier circuit connected between the output node and a connection node of the first capacitor and the first resistor; and
a second capacitor connected between the output node and the reference voltage node.

12. An electronic apparatus comprising:
a power transduction circuit configured to transduce power;
an electronic circuit including an output node to output a DC signal indicating a rate of change over time of output voltage of the power transduction circuit; and
a control circuit configured to control the power transduction circuit based on the DC signal,
wherein the electronic circuit includes:
a first capacitor and a first resistor connected in series between a reference voltage node and a measurement target node that outputs a voltage transduced by the power transduction circuit;
a first rectifier circuit connected between the output node and a connection node of the first capacitor and the first resistor; and
a second capacitor connected between the output node and the reference voltage node.

13. The electronic apparatus according to claim 12, wherein
the power transduction circuit includes a switching element connected to the measurement target node, and
the control circuit controls a voltage at a control terminal of the switching element based on the DC signal so that the DC signal has a predetermined voltage level.

14. The electronic apparatus according to claim 12, wherein the electronic circuit includes
a switch connected between the output node and the reference voltage node, the switch being to control whether to discharge accumulated electric charge of the second capacitor.

15. The electronic apparatus according to claim 12, wherein the switch is turned on to discharge the second capacitor after a voltage level of the DC signal output from the output node is stabilized.

16. The electronic apparatus according to claim 12, wherein the first capacitor has a capacitance 1/10 or less of a parasitic capacitance of the measurement target node.

17. The electronic apparatus according to claim 12, wherein a capacitance of the first capacitor, a capacitance of the second capacitor, and a resistance of the first resistor are set to a time constant of 100 nsec or less, the time constant being required until the DC signal according to a voltage change of the measurement target node is output from the output node.

18. The electronic apparatus according to claim 17, wherein the capacitance "C1" of the first capacitor, the capacitance "C2" of the second capacitor, and the resistance "R" of the first resistor are set to make the time constant "T" satisfy Formula (3):

$$T \geq 2.2 \times R \times (C1+C2) \qquad (3).$$

19. The electronic apparatus according to claim 12, wherein a voltage "Vout" of the output node is expressed by Formula (4) using the rate of change over time dv/dt of voltage at the measurement target node, a capacitance "C1" of the first capacitor, a capacitance "C2" of the second capacitor, and a resistance "R" of the first resistor:

$$V\text{out}=C1 \times R \times (dv/dt) \times [1-\exp\{-t/R(C1+C2)\}] \qquad (4).$$

20. The electronic apparatus according to claim 12, wherein the electronic circuit comprises
a first detector connected to the measurement target node and to output, from a first output node, a first DC signal indicating a rate of change over time of rising voltage at the measurement target node; and
a second detector connected to the measurement target node and to output, from a second output node, a second DC signal indicating a rate of change over time of falling voltage at the measurement target node,
wherein the first detector includes a third capacitor corresponding to the first capacitor, a second resistor corresponding to the first resistor, a second rectifier circuit corresponding to the first rectifier circuit, and a fourth capacitor corresponding to the second capacitor, and
the second detector includes a fifth capacitor corresponding to the first capacitor, a third resistor corresponding to the first resistor, a third rectifier circuit corresponding to the first rectifier circuit, and a sixth capacitor corresponding to the second capacitor.

* * * * *